United States Patent [19]

Vargo et al.

[11] Patent Number: 5,696,207

[45] Date of Patent: Dec. 9, 1997

[54] FLUROROPOLYMERIC SUBSTRATES WITH METALLIZED SURFACES AND METHODS FOR PRODUCING THE SAME

[75] Inventors: Terrence G. Vargo, Kenmore, N.Y.; Jeffrey M. Calvert, Alexandria, Va.; Joseph A. Gardella, Jr., Buffalo, N.Y.; Mu-San Chen, Elicott City, Md.

[73] Assignees: Geo-Centers, Inc., Newton Centre, Mass.; The United States of America as represented by the Secretary of the Navy, Washington, D.C.

[21] Appl. No.: 697,933

[22] Filed: Sep. 3, 1996

Related U.S. Application Data

[63] Continuation of Ser. No. 354,857, Dec. 9, 1994, abandoned.

[51] Int. Cl.$^6$ .................................................... C08F 8/42
[52] U.S. Cl. ........................ 525/326.2; 525/367; 525/371
[58] Field of Search .................................. 525/326.2, 367, 525/371

[56] References Cited

U.S. PATENT DOCUMENTS

| | | |
|---|---|---|
| 4,548,867 | 10/1985 | Ueno et al. . |
| 4,946,903 | 8/1990 | Gardella, Jr. et al. . |
| 5,051,312 | 9/1991 | Allmer . |
| 5,079,600 | 1/1992 | Schnur et al. . |
| 5,206,309 | 4/1993 | Altman . |
| 5,266,309 | 11/1993 | Gardella, Jr. et al. . |
| 5,342,737 | 8/1994 | Georger et al. . |
| 5,389,496 | 2/1995 | Calvert et al. . |
| 5,500,315 | 3/1996 | Calvert et al. . |

OTHER PUBLICATIONS

Calvert et al, "Lithographically Patterned Self-Assembled Films", *Organic Thin Films and surfaces*, A. Ullman, Ed. (Academic Press, Boston, in press) vol.1.
Dressick et al, *Journal of the Electrochemical Society*, vol. 141, pp. 210–220 (1994).
Dulcey et al, *SPIE*, vol. 1925, pp. 657–665 (1993).
Dressick et al, *Chem. Mater.*, vol. 5, pp.148–150 (1993).
Dulcey et al, *Science*, vol. 252, pp. 551–554, (1991).
Dressick et al, *Jpn. J. Appl. Phys.*, vol 32, pp.5829–5839 (1993).
Calvert et al, *Mat. Res. Soc. Symp. Proc.*, vol. 260, pp. 905–910 (1992).
Calvert et al, *Polymers for Microelectronics*, Thompson et al eds., ACS Symposium Series vol. 537, pp. 210–219, American Chemical Society Press, Washington, D.C. 1993.
Calvert et al, *J. Vac. Sci. Technol.*, vol. B 11(6), pp. 2155–2163.
Calvert et al, *Solid State Technology*, vol. 34, pp. 77–82 (1991).
Rye et al, *J. Electrochem. Soc.*, vol. 132, No. 6, (1992).
Calvert et al, *SPIE*, vol. 1924, pp. 30–41 (1993).
Meyer et al, "Metallization of Polytetrafluoroethylene (PTFE) by Means of Plasma–Enhanced Chemical Vapour Deposition", pp. 121–139, *Metallized Plastics 2*, K.L. Mittal, Ed., Plenum Press, NY 1991.
Hollahan et al, *Journal of Applied Polymer Science*, vol. 13, pp. 807–816 (1969).
Yasuda et al, *Journal of Polymer Science: Polymer Chemistry Edition*, vol. 15, pp. 991–1019 (1977).
Nakamoto et al, *J. Phy. Chem.*, vol. 64, pp.1420–1425 (1960).
Abbott et al, *Science*, vol. 257, pp. 1380–1382 (1992).
Bright et al, *Analytica Chimica Acta*, vol. 262, pp. 323–330 (1992).
Vargo et al, *J. Polym. Sci. Sci. Polym. Chem. Ed.*, vol. 29, pp. 555–570 (1991).
Hook et al, *Langmuir*, vol. 7, pp. 142–151 (1991).
Ranieri et al, *J. Biomed. Mater. Res.*, vol. 29, pp. 779–785.
Vargo et al, *Langmuir*, vol. 8, pp. 130–134 (1992).
Henry, *Metal Finishing Guidebook Directory*, vol. 86, pp. 397–414 (1988).

*Primary Examiner*—Bernard Lipman
*Attorney, Agent, or Firm*—Oblon, Spivak, McClelland, Maier & Neustadt, P.C.

[57] ABSTRACT

Fluoropolymeric substrates with metallized surfaces may be prepared by self-assembly of a chemisorbed layer of a metal ion-chelating organosilane onto a fluoropolymer surface after radio-frequency glow discharge plasma surface hydroxylation. The silane covalently binds an aqueous palladium catalyst and subsequent electroless deposition yields homogeneous or patterned metal deposits that exhibit excellent adhesion to the fluoropolymer.

10 Claims, 1 Drawing Sheet

FLUROROPOLYMERIC SUBSTRATES WITH METALLIZED SURFACES AND METHODS FOR PRODUCING THE SAME

This application is a Continuation of application Ser. No. 08/354,857, filed on Dec. 9, 1994, now abandoned.

BACKGROUND OF THE INVENTION

1. Field of the Invention

The present invention relates generally to fluoropolymeric substrates with metallized surfaces and methods for producing such metallized surfaces.

2. Discussion of the Background

Fluoropolymers such as poly(tetrafluoroethylene) (PTFE) and Teflon® are of considerable technological importance, because their low surface energy and stable C-F bonds provide surfaces that are inert to most solvents and chemicals and that prevent the adhesion of most chemical and biological materials (P. Burggraf, *Semicond. Int.*, vol. 11 (no. 8), p. 55 (1988)). The low dielectric constants of fluoropolymers make them particularly attractive as dielectric layers for microelectronic applications (L. M. Siperko et al, *J. Adhes. Sci. Technol.*, vol. 3, p. 157 (1989); H. Meyer et al, in *Metallized Plastics 2: Fundamental and Applied Aspects*, L. Mittal, Ed., at p. 121, Plenum, N.Y. (1991)). However, for certain applications in which it is desirable to use fluoropolymers as a substrate, relatively few chemical pathways exist for the stable attachment of materials to the fluorinated surfaces.

Approaches for promoting adhesive bonding of various materials, including metals, to fluoropolymer surfaces typically use harsh chemical reagents (highly reducing alkalies, such as sodium naphthalids) or require complex sputtering or ion beam bombardment process (L. M. Siperko et al, *J. Adhes. Sci. Technol.*, vol. 3, p. 157 (1989); H. Meyer et al, in *Metallized Plastics 2: Fundamental and Applied Aspects*, L. Mittal, Ed., at p 121, Plenum, N.Y. (1991)). A recently reported process (R. R. Rye et al, *J. Electrochem. Soc.*, vol. 139, L60 (1992)) involves cross-linking of PTFE with x-rays followed by chemical etching and then vapor deposition of Cu by decomposition of an organocopper reagent. These methods are often difficult to use, may be environmentally problematic, and can adversely affect the chemical and morphological characteristics of the surface.

U.S. Pat. No. 4,548,867 (Ueno et al) discloses a fluorine-containing synthetic resin having improved surface properties as evidenced by increased wettability with water, printability and susceptibility to adhesive bonding. The fluoropolymer is exposed to a low temperature plasma comprising an organic nitrogen-containing gas. Instead of modifying the atomic composition of the fluoropolymer starting material, Ueno et al form a thin "layer" of a nitrogen-containing wettable material thereto. Consequently, the adherence of such an overcoating tends to alter the microstructural morphology of the original polymer, especially with respect to pore size. This coating also alters desirable surface properties exhibited by the original fluorinated material.

In some early work, it has been found that exposure of polyolefins and perfluorinated polymers to low power radio frequency electrodeless discharges in inert gas atmospheres produced favorable results over wet chemical methods. Their improvement in the bondability of surfaces was limited and attributed to the formation of a highly cross-linked surface layer. Studies of Hollahan et al, *J. Polym. Sci.*, vol. 13, p. 807 (1969) aimed at rendering polymer surfaces biocompatible included the interaction of PTFE with plasmas excited in ammonia and nitrogen/hydrogen mixtures, the goal being the introduction of amino groups into the polymer surface. However, the long exposure times and high powers employed provided only limited results, and further, are thought to have produced significant changes not only in the surface chemistry, but also the native bulk properties. The morphology of the surface was also severely affected.

In another ESCA study entitled "ESCA Study of Polymer Surfaces Treated by Plasma," Yasuda et al, *J. Polym. Sci., Polym. Chem. Ed.*, vol. 15, p. 991 (1977) the effects of discharges in argon and nitrogen on surface chemistry were considered on a range of polymers. PTFE was found to be particularly susceptible to defluorination and the introduction of oxygen and nitrogen moieties into the surface.

It has recently been shown that fluoropolymers can be functionalized by chemisorption of organosilane reagents to plasma-treated fluoropolymer surfaces (T. G. Vargo et al, *J. Polym. Sci. Polym. Chem. Ed.*, vol. 29, p. 555 (1991); D. J. Hook et al, *Langmuir*, vol. 7, p. 142 (1991); F. V. Bright et al, *Anal. Chim. Acta*, vol. 262, p. 323 (1992); T. G. Vargo et al, *Langmuir*, vol. 8, p. 130 (1992); J. P. Ranieri et al, *J. Biomed. Mater. Res.*, vol. 27, p. 917 (1993); and U.S. Pat. No. 5,266,309). Radio-frequency glow discharge (RFGD) treatment of the fluoropolymer surface using a novel gas-liquid mixture (T. G. Vargo et al, *J. Polym. Sci. Polym. Chem. Ed.*, vol. 29, p. 555 (1991)) partially defluorinates the surface with simultaneous addition of hydroxyl functionalities. An important aspect of this plasma treatment is that the surface is modified without inducing significant roughening. The hydroxylated surface exhibits a reactivity similar to that of Si-OH groups on silicon oxide surfaces and can be reacted with organosilane reagents to covalently immobilize various desired functionalities on the fluoropolymer surface (D. J. Hook et al, *Langmuir*, vol. 7, p. 142 (1991); F. V. Bright et al, *Anal. Chim. Acta*, vol. 262, p. 323 (1992); T. G. Vargo et al, *Langmuir*, vol. 8, p. 130 (1992); J. P. Ranieri et al, *J. Biomed. Mater. Res.*, vol. 27, p. 917 (1993)). It has also been shown that use of a mechanical mask can restrict plasma treatment to particular regions of the surface; subsequent attachment of the organosilane occurs only in the areas exposed to the plasma. Such patterned aminoalkylsilane-fluoropolymer surfaces have been successfully used as chemical templates for the selective attachment and growth of neurons (T. G. Vargo et al, *Langmuir*, vol. 8, p. 130 (1992); J. P. Ranieri et al, *J. Biomed. Mater. Res.*, vol. 27, p. 917 (1993)).

It has also been shown that selective, adhesive metallization of a wide range of nonfluorinated substrates to submicrometer resolution can be accomplished by electroless deposition (J. M. Calvert et al, in *Polymers for Microelectronics*, C. G. Wilson et al, Eds., at p. 210, ACS Symposium Series vol. 537, American Chemical Society Press, Washington, D.C. (1993); J. M. Calvert et al, *Proc. Soc. Photo.-Opt. Instrum. Eng.*, vol. 1924, p. 30 (1993); J. M. Calvert in *Organic Thin Films and Surfaces*, vol. 1, A. Ullman, Ed. Academic Press, Boston, in press; J. M. Calvert et al, *J. Vac. Sci. Technol.*, vol. B9, p. 3447 (1991); J. M. Calvert et al, *Solid State Technol.*, vol. 34 (no. 10), p. 77 (1991); C. S. Dulcey et al, *Proc. Soc. Photo.-Opt. Instrum. Eng.*, vol. 1925, p. 657 (1993)). Surfaces functionalized with self-assembled monolayer (SAM) films of ligand-bearing organosilanes covalently bind a Pd catalyst (W. J. Dressick et al, *Chem. Mater.*, vol. 5, p. 148 (1993); W. J. Dressick et al, *J. Electrochem. Soc.*, in press) from aqueous solution and are then metallized by immersion in an aqueous electroless deposition bath.

3

However, there is no report of a convenient method for providing a fluoropolymer substrate with a metallized surface. In addition, there is no report of a convenient method for preparing a fluoropolymer substrate with a metallized surface which exhibits good adhesion to the flouropolymer substrate. Accordingly, there remains a need for such a method. There also remains a need for fluoropolymer substrates having a metallized surface produced by such a method.

SUMMARY OF THE INVENTION

Accordingly, it is one object of the present invention to provide a novel method for preparing fluoropolymer substrates with a metallized surface.

It is another object of the present invention to provide a method for preparing fluoropolymer substrates with a metallized surface which is convenient.

It is another object of the present invention to provide a method for preparing fluoropolymer substrates with a metallized surface which exhibits good adhesion to the fluoropolymer substrate.

It is another object of the present invention to provide a method for preparing fluoropolymer substrates with a patterned metallized surface.

It is another object of the present invention to provide novel fluoropolymer substrates with a metallized surface which are prepared by such a process.

These and other objects, which will become apparent during the following detailed description, have been achieved by the inventors' discovery that fluoropolymer substrates with a metallized surface may be prepared by a process comprising:

(a) contacting (i) a fluoropolymer substrate having a surface with ligands which will bind an electroless metallization catalyst with (ii) an electroless metallization catalyst, to obtain a catalytic surface; and (b) contacting said catalytic surface with an electroless metallization solution, to obtain a metallized surface.

Thus, the present invention provides for adhesive metallization of fluoropolymer substrates. This aspect of the present invention relates to products and processes of making such products whereby areas of widely varying reactivity are created with sub-micron lateral resolution on substrates initially comprised of homogeneous fluoropolymers or a non-fluorinated substrate having a fluorinated surface or a fluorocarbon coated surface, initially without fluoropolymeric surface chemistry, but treated so as to provide surface fluorination or a deposited fluoropolymeric coating. In each instance, a fluoropolymer having a surface with hydroxyl groups is reacted with a ligand-bearing coupling agent, and metallized by electroless metal deposition by methods well-known in the art. Suitable ligand-bearing coupling agents include organosilanes, organotitanates, organozirconates, or other compounds containing both a ligand which will bind an electroless metallization catalyst and a functional group which will covalently couple to the hydroxyl groups on the surface.

In one embodiment of the invention, homogeneous metallization of either a fluoropolymer, or a fluorinated surface, or fluorocarbon-coated surface of a non-fluorinated substrate is achieved by first treating the surface having hydroxyl groups with the above-described coupling agent to produce mono- or multi-molecular layers covalently linked to the fluorine-containing substrate. The self-assembling film procedure is capable of producing uniform, ultra-thin molecular films having externally accessible ligands which serve as anchor sites for an electroless metallization catalyst which functions to bind metal ions in an electroless plating bath. Such methods are suitable for producing homogeneous metallization of the above surfaces. Likewise, the reactivity of substrates can be altered, for example, by photolithographic methods with U.V. radiation to inhibit attachment of a given precursor in selected regions. In one example, masked portions of the substrate not exposed to the radiation are capable of bonding with catalytic precursors and are metallized. Such methods of masking permit substrates to be patterned with reactive sites to sub-micron dimensions providing the capability of depositing films having laterally constrained regions on the order of sub-micron resolutions.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
FIG. 1 is an optical micrograph showing a drop of water (on the left) and a drop of methanol (on the right) placed on a patterned plasma-treated fluorinated ethylene-propylene copolymer surface.

Thus, in a first embodiment, the present invention provides a method for preparing fluoropolymer substrates with a metallized surface. Useful fluoropolymer starting substrates include both fluorocarbon polymers and fluorohydrocarbon polymers. This includes fluoropolymers having a carbon backbone with atoms bonded thereto consisting of either fluorine or both fluorine and hydrogen provided that when hydrogen atoms are present fluorine shall also be present in a fluorine to hydrogen ratio of at least 1:3. Preferably, the fluoropolymers include materials having a critical surface tension ($\gamma_c$) ranging generally from about 15 to about 30 dynes/cm. Specific representative examples of useful low surface energy fluorocarbon polymers are the perfluorinated polymers, e.g., polytetrafluoroethylene (PTFE), polymers of hexafluoropropylene and tetrafluoroethylene like fluorinated ethylene-propylene (FEP) copolymers, etc. Suitable low surface energy fluorohydrocarbon starting polymers include resins like polytrifluoroethylene, poly(vinylidene fluoride) (PVDF), poly(vinyl fluoride), poly(vinyl difluoride), including piezo and pyroelectric poled PVDF, and the like. The molecular weight of the fluoropolmer is not critical so long as it is a solid.

It is also to be understood that the term fluoropolymer substrate includes those substrates which are of materials other than a fluoropolymer, such as copolymers containing fluorinated segments or blocks which segregate to the surface, e.g., fluorinated polyether urethanes, fluorinated polystyrenes, or other such resins containing fluorinated functionality, such as Teflon AF® (Dupont), which present low energy fluorinated surfaces and other types of materials which have been treated to provide them with a surface of fluoropolymer.

The fluoropolymer substrate having a surface with ligands which will bind an electroless metallization catalyst can be conveniently prepared by a two-stage process as described in U.S. Pat. No. 5,266,309. First, a fluoropolymer substrate is treated to introduce hydroxyl groups on at least one surface. Second, the fluoropolymer substrate having a surface with hydroxyl groups is reacted with a coupling agent to introduce ligands which will bind an electroless metallization catalyst.

The fluoropolymer substrates having a surface with hydroxyl groups may be prepared as described in U.S. Pat. Nos. 4,946,903 and 5,266,309, which are incorporated herein by reference. Specifically, the surface having hydroxyl groups is prepared by a plasma treatment process in which the fluoropolymers are exposed to a single or a series of relatively low power radio frequency glow discharges (RFGD). The target fluoropolymers generally can be in the form of a sheet, premolded or coated article, such as a porous PTFE membrane or filter, e.g., Goretex®, where, for example, increased permeability of ions would be desirable without altering pore characteristics of the native material; a bioprobe of conventional design coated with Teflon® or a molded, implantable prosthetic device where, for instance, it would be desirable to modify its adhesive and/or surface reactivity characteristics to blood platelet attachment.

Instead of a plasma treatment with purely a gas, the radio frequency glow discharge is conducted in an atmosphere of a gas/vapor mixture at pressures of under 1,000 mTorr, and more preferably, from about 50 to 200 mTorr, and power loadings of less than or equal to 100 watts. In certain cases, it may be preferred to carry out the radio frequency glow discharge modification step using a metal (e.g., nickel or gold) grid (300 to 1000 mesh) which is placed at a distance of within 1 mm, but not touching, the surface of the fluoropolymer substrate. This will not result in a patterned surface but has shown in some cases to provide better homogeneity of the modification with a simultaneous decrease in plasma exposure times necessary for surface modification.

By exposing the fluoropolymer material to either a single or a series of radio frequency glow discharge gas/vapor plasmas consisting of admixtures of hydrogen gas ranging from 20% to 99% by volume, and 1 to about 80% by volume of a vapor from liquids, such as water, methanol, formaldehyde and mixtures thereof, 1 to about 98% of the surface fluorine atoms are permanently removed in a controlled/regulated manner and replaced with oxygen atoms or low molecular weight oxygen-containing functionality along with hydrogen atoms. The fluoropolymer surface having hydroxyl groups may be represented as follows:

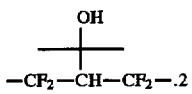

The reaction of the fluoropolymer substrate having a surface with hydroxyl groups with the coupling agent may also be carried out as described in U.S. Pat. No. 5,206,309. In particular, the fluoropolymer substrate having a surface with hydroxyl groups may be reacted with a wide range of organosilane coupling agents of the general formula $$Y\text{-}(CH_2)_n\text{-}Si\text{-}(X)_3 \qquad (I)$$

in which Y is any group which contains a ligand which will bind an electroless metallization catalyst; X is typically chlorine, bromine, fluorine, alkyl having from 1 to 4 carbon atoms, chloromethyl, monoethylamino, dimethylamino, methoxy, ethoxy, propoxy, isopropoxy, butoxy or trimethylsilyl, trimethylsilylamino; and n is an integer of from 1 to 17, preferably from 2 to 8. Specific examples of Y include $C_{1-4}$-alkylamino, di-$C_{1-4}$-alkylamino, 2-aminoethylamino, diethylenetriamino, pyridyl (including 2-pyridyl and 4-pyridyl), bipyridyl (including 2,2'-bipyridyl), diphenylphosphino, mercapto, isonitrilo, nitrilo (—CN), imidazoyl, pyrrolyl, cyclopentadienyl, glycidoxy and vinyl. Specific representative ligand-bearing organosilanes are 3-aminopropyltriethoxysilane, 3-mercaptopropyltrimethoxysilane, 2-pyridylethyltrimethoxysilane, and N-(2-aminoethyl)-3-aminopropyltrimethoxysilane (EDA), and trimethoxysilylpropyldiethylenetriamine, to name but a few.

Without wishing to be bound by theory, the process of preparing the fluoropolymer substrates having a surface with ligands which will bind an electroless metallization catalyst can be illustrated by the following reaction:

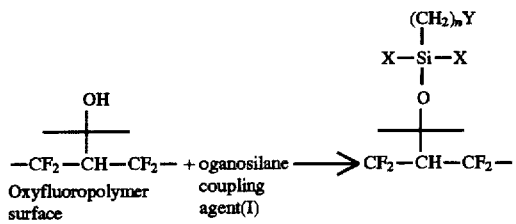

wherein the values for X, Y and n are the same as formula (I).

The reaction of the fluoropolymer surface having hydroxyl groups with the compound of formula (I) may be carried out by contacting the surface having hydroxyl groups with neat, liquid compound of formula (I) or a solution of the compound of formula (I) in a solvent such as benzene, toluene, hexane, heptane, methanol, and water. The reaction may be carried out at room temperature or at a higher temperature such as the boiling point of the inert solvent. The reaction time will depend in part on the identity of X. However, the selection of the appropriate reaction time and other conditions for any given compound of the formula (I) is well within the abilities of the skilled artisan. For example the extent of coupling may be monitored by techniques such as contact angle, x-ray photoelectron spectroscopy, IR, and UV-visible spectroscopy.

The surface which has ligands which will bind an electroless metalization catalyst is rendered catalytic by contacting it with an electroless metallization catalyst, which results in the ligand-bearing organosilane groups acting as binding sites for the catalyst. The contacting of the surface having ligands which will bind an electroless metallization catalyst with the electroless metallization catalyst may be carried out as described in U.S. Pat. No. 5,079,600 and U.S. patent application Ser. No. 08/062,706, both of which are incorporated herein by reference. A variety of compounds may be employed as the electroless metallization catalyst in accordance with the present invention, such as palladium, platinum, rhodium, iridium, nickel, copper, silver and gold. Palladium or palladium-containing compounds and compositions generally provide superior catalytic activity and therefore are preferred. Particularly preferred palladium catalysts are based on colloidal solutions derived from palladium dichloride and $Na_2PdCl_4$.

The electroless metallization catalysts useful in the processes of the present invention are preferably applied to the substrate as a colloidal solution, for example from an aqueous solution or an organic solvent.

Means for contacting a substrate with a catalyst solution may vary widely and include immersion of the substrate in a solution, puddle application, as well as a spray application. The catalyst solution contact time required to provide complete metallization of the contact area can vary with catalyst solution composition and age.

A variety of catalyst solutions have been successfully employed, with solutions stabilized against decomposition being preferred. Thus, the catalyst solution may comprise ancillary ligands, salts, buffers and other materials to enhance catalyst stability. Though not wishing to be bound by theory, it is believed many of the catalyst solutions useful in the present invention decompose over time by oligomerization and formation of insoluble oxo-compounds, for example as reported by L. Rasmussen and C. Jorgenson, *Acta. Chem. Scand.*, vol. 22, p. 2313 (1986). It is believed the presence of catalyst oligomers in the catalyst solution can affect the ability of the catalyst to induce metallization and/or inhibit selectivity of metallization of a patterned substrate. For example, as such catalyst oligomers increase in molecular weight, their solubilities decrease and precipitation of the catalyst can occur.

Suitable agents for stabilizing a catalyst solution can vary with the particular catalyst employed, as is apparent to those skilled in the art. For instance, a colloidal metallization catalyst of $PdCl_4^{2-}$ can be stabilized in aqueous solution by addition of excess chloride ion and decreasing pH to control formation of oxo-bridged oligomers of the catalyst, of proposed structures such as $Cl_3PdOPdCl_2(H_2O)^{3-}$ and $Cl_3PdOPdCl_3^{4-}$. This is supported by the greater stability of catalyst solutions comprising sufficient concentrations of sodium chloride or tetraethylammonium chloride (TEACl) relative to the stability of aqueous $Pdcl_4^{2-}$ solutions not containing such agents. Such catalyst stabilization can be accomplished by adjustment of chloride ion concentration during preparation of the catalyst, or by adjustment of chloride ion concentration after the catalyst solution has attained full catalytic activity. In addition to chloride, other anions that prevent the formation of catalyst oligomers should also be suitable agents for stabilizing a catalyst solution, for example bromide ions.

Cation effects have also been observed. For example, suitable use of sodium chloride with $Na_2PdCl_4$ provides an active and stabilized catalyst solution. Replacing sodium chloride with ammonium chloride in such a solution, however, results in a solution with little or no activity as a metallization catalyst. In this case, it is believed that the lack of catalytic activity may be the result of the formation of stable cis- or trans-$(NH_3)PdCl_2$ species in solution. Replacing sodium chloride with TEACl provides a solution that requires a shorter induction period to reach full activity, and once active, remains selective and stable only for a few days. It is further noted that while a number of cations may be suitable, cation selection may be dictated by the specific metallization process.

It also has been found that catalyst solutions of higher (less acidic) pH, e.g. pH of greater than 4, can be stabilized with a suitable buffer solution. Preferably, the pH of a catalyst solution is controlled by a buffer component which does not appreciably coordinate with the metallization catalyst. For a Pd(II) metallization catalyst, a preferred buffering agent is 2-(N-morpholino)ethanesulfonic acid, referred to herein as MES, available from the Aldrich Chemical Company. This buffer has a $pK_a$ of 6.15 and has been described in *Good, et al., Biochemistry*, Vol. 5(2), pp.467–477 (1966).

Additionally, it has been found that solution preparation methods can affect the stability and metallization activity of a catalyst solution. For example, an aqueous catalyst solution comprising NaCl and $Na_2PdCl_4.3H_2O$ reaches full activity as a metallization catalyst about 24 hours after preparation at room temperature. Addition of a prescribed amount of acetate buffer to this active solution maintains its catalytic activity. In contrast, preparation of a catalyst solution by simultaneous mixing of acetate buffer, NaCl, and $Na_2PdCl_4.3H_2O$ in aqueous solution yields a catalyst solution which requires about 11 days to reach full activity as a metallization catalyst.

It has also been found that components of a catalyst solution can compete with the catalyst for binding with substrate ligating sites. For example, for 4,4'-(di(carboxylic acid-(N-3-(trimethoxysilyl)propyl)amide))-2,2'bipyridine, the $pK_a$ values of the pyridyl groups are about 4.44 and 2.6, for mono- and di-protonation respectively. See, K. Nakamoto, *J. Phys. Chem.*, vol. 64, p. 1420 (1960). Thus, in the cae of a $PdCl_2/HCl$ (aq) catalyst solution, HCl may protonate the pyridyl groups and effectively compete for these sites with the palladium catalyst. While electrostatic interactions may still occur between the metallization catalyst and such a protonated ligating group, coordination type binding will be substantially reduced. It has thus been found that elimination of such ligation competitors from a catalyst solution increases coordination type binding of the catalyst to the substrate ligation functionality.

Those areas of the surface of the fluoropolymer substrate which have been rendered catalytic are then subjected to electroless metal deposition. The catalytic layer acts to reduce metal ions contained in the electroless plating bath. Electroless plating methods are well-known in the art. A typical useful electroless plating process is disclosed by J. Henry, *Metal Finishing Guidebook Directory*, Vol. 86, 397–414 (1988). Other examples of electroless plating methods are also suitable, and are disclosed by J. M. Calvert et al, Polymers for Microelectronics, *American Chemical Symposium Series*, Vol. 260, pg. 905 (1992). Electroless metallization techniques are also disclosed in U.S. Pat. No. 5,079,600. The foregoing publications are incorporated by reference herein. Among the metals which may be plated by these techniques include Ni, Co, Au, Cu, Pd, and various alloys.

The present invention also provides conductive metallized pathways on fluoropolymer surfaces. Such metallized pathways may be formed by metallizing the fluoropolymer surface in a patternwise fashion. The patternwise metallization of the fluoropolymer surface may be achieved in a number of ways. A first method includes steps whereby a metallic mask or grid having the desired lateral dimensions and pattern is applied during the radio frequency glow discharge step such that the hydroxyl groups are formed only on the regions exposed via open areas in the mask or grid. The surface is then reacted with a ligand-bearing organosilane coupling agent, followed by application of an electroless metallization catalyst to form a catalytic layer.

The substrate with the catalytic surface can then be treated by immersion into an electroless nickel plating bath to form controlled overlayers of nickel metal. The nickel surface can then act as a conductive surface or as an adhesive underlayer for applying other conductive metals, such as platinum, gold, copper, nickel alloys, palladium, and the like, by subsequent electroless, immersion plating, or electrolytic deposition.

In this type of process, a pattern of metallization is obtained which is a negative image of the metallic mask or grid used in the glow discharge step. That is, the regions covered by the mask will not be metallized, because the first step includes placing the fluorinated substrate in an RFGD reactor with a metallic grid, e.g., nickel, to form hydroxyl groups on only those regions exposed or not covered by the metallic grid. This method enables the formation of spatially limited patterned regions having spatial resolutions on the order of 1 to 5 μm. Once completed, silanization and metallization will occur only on those areas which were initially exposed to the RFGD plasma.

In a second method, the patterning of metals or conduction pathways on fluoropolymer surfaces is achieved via photolithographic methods. Fluoropolymer surfaces having hydroxyl groups are first silanized using a radiation sensitive organosilane, which includes such representative examples as the chlorosilanes, methoxysilanes, ethoxysilanes, silazanes, and the like, which also contain a radiation-sensitive ligand, such as pyridyl, which will bind an electroless metallization catalyst. The surface is then irradiated with UV radiation, e.g., 193 nm (or other types of actinic radiation sources such as UV, x-rays, ion beams, or electron beams) in selected regions by interposing a photolithographic mask between the source and substrate. By irradiating selected regions of the organosilane with UV light the reactive moieties at the irradiated silane molecule undergo photoinduced cleavage. When, for example, a palladium-based colloidal catalyst, or other catalytic precursor, is spread over the surface of the irradiated substrate it does not adhere to the areas whose reactive moieties were inactivated by exposure to the radiation. Hence, when the substrate is immersed into an electroless plating bath, plating occurs only where the catalytic precursor is adherent to the silane film covalently bonded to the fluoropolymer surface.

In this type of process, a pattern of metallization is obtained which is a positive image of the photolithographic mask used in the irradiation step. That is, the regions covered by the mask will be metallized.

The present invention provides a convenient method for preparing fluoropolymer substrates with metallized surfaces. The fluoropolymer substrates with metallized surfaces prepared according to the present method exhibit excellent adhesion between the substrate and the metallized layer. These metallized fluoropolymer substrates may be used as conductive components in circuits of electronic devices such as multichip modules, microwave circuits, or as electrodes for biosensors.

In the field of electronics the ability to pattern electrical conduits and circuitry at feature sizes ranging from mil geometry to the submicron level has become a major industry. This has been demonstrated largely on ceramic and metallic materials which due to high dielectric constants and high surface energies are complicated with static charge build-ups resulting in current cross-talk and surface corrosion, or on moderate dielectric polymers such as epoxy and polyimide. The ability to utilize, for example, ultra-low dielectric materials, such as PTFE and FEP would advantageously reduce these problems and provide a significant technological advance in the field of high frequency, microwave microelectronics. Both the economic and technical problems in this field of electronics can be bridged via the methods of the present invention.

In the field of sensors, the ability to place and pattern electrical conduits and circuitry onto low surface energy fluoropolymer materials represents a major advantage over currently used materials. Fluoropolymer substrates minimize fouling from the environment in which the sensor is used, e.g., biosensor in blood, immunosensor in blood/plasma, or pollutant sensor in public or natural water systems.

Other features of the invention will become apparent in the course of the following descriptions of exemplary embodiments which are given for illustration of the invention and are not intended to be limiting thereof.

EXAMPLES

Example 1

A sheet of FEP (2×2 inches with thickness of 50 mils) is placed in a RFGD reactor and treated with a hydrogen/methanol plasma as described in Example III of U.S. Pat. No. 5,266,309 and reacted with an organosilane bearing a ligand from the amine, diamine and pyridine classes of silanizing agents. This includes such representative examples as aminopropyltriethoxysilane, ethylenediaminepropyltrimethoxysilane and 2-ethylpyridyltrimethoxysilane. In order to initiate electroless metal deposition a Pd-based catalyst is used. In this example, the colloidal catalyst prepared by dissolving proportionate amounts equal to 11.5 mg of $Na_2PdCl_4.3H_2O$ in 1 ml of 1.0M NaCl (aq.) buffer, and adding 10 ml of 0.1M pH 5 morpholinoethanesulfonic acid (aq) buffer, and diluting to 100 ml with $H_2O$ is used. After standing at room temperature for at least 30 minutes, but optimally 24 hours, a 10 ml aliquot of the solution is removed and replaced with 10 ml of 1.0M NaCl (aq) to yield active PD1 catalyst. After removal from the catalyst bath the substrate material is then placed into an electroless plating bath, e.g., Niposit® 468, 10% strength from Shipley Co. This provides a surface comprised of nickel metal. CoB electroless plating bath can also be employed to provide a surface layer of cobalt metal.

Example 2

An expanded PTFE tube from W. L. Gore is placed in an RFGD reactor and treated with hydrogen/vapor plasma according to methods described herein for creating an oxyfluorinated surface. In this particular case the inside of the ePTFE tube is masked to inhibit the formation of hydroxyl groups on the inside of the ePTFE tube, and thus, inhibit subsequent silanization and metallization. After rinsing in methanol, the tube is placed in a ca. 1% (V/V) solution of aminopropyltriethyoxysilane (UCT) in hexane at room temperature for ca. 15 seconds. The tube is then rinsed in hexane to remove any silane not covalently bonded to the oxyfluorinated surface. Cataposit 44® palladium chloride/tin chloride colloidal catalyst (Shipley Co., Marlborough, Mass.) is prepared as directed by the manufacturer. The expanded PTFE material is then covered by the Pd/Sn colloidal activator for ca. 15 minutes and rinsed copiously with water. The tube is then immersed for 3 minutes in Accelerator 19® (Shipley Co., Marlborough, Mass.), followed by immersion for 10 minutes in Cuposit 328® electroless copper plating bath (Shipley Co., Marlborough, Mass.) prepared in accordance with the manufacturer's directions for using. The ePTFE tube is then removed from the bath and rinsed with water to reveal a copper metal coat on the outside of the ePTFE tube which provides stability and prevents gas or liquid flow from the inside of the tube through the outer walls.

Example 3

A sheet of PTFE to be used for integrated microcircuitry or multi-chip module applications requires conducting metal pathways having spatial resolutions greater than 1 micrometer. The PTFE sheet is placed in an RFGD hydrogen/methanol plasma such that it is covered with a nickel grid which is lithographed to have an appropriate or desired pattern where line widths of the circuit pattern have spatial resolutions no smaller than 1 μm. After exposure to the plasma treatment the materials are then silanized and metallized via treatments according to methods described in Example 1 such that conducting metal lines or pathways, e.g., nickel, are created with the image of the metallic grid's open spaces used to mask the material during the RFGD exposure of the surface.

Example 4

The surface of an FEP substrate is RFGD treated and then silanized with a 1 vol. % solution of 2-[2-(trimethoxysilyl) ethyl]pyridine (PYR) in 95 vol. % methanol 5 vol. % water 1 mM in HOAc. The PYR film is patterned by exposure to masked deep-UV radiation. A 4 J/cm$^2$ radiation dose delivered at 193 nm using a Questek® 2000 ArF excimer laser leads to the removal of the pyridyl chromophore from the substrate. Patterned deep UV irradiation of PYR films leads to the production of positive tone ligand images on the surface of the FEP. Intact pyridyl ligands can interact with Pd(II) solution species such that one can plate patterns of metals through the electroless metal deposition methods as disclosed in Example 1 above. This produces a pattern of metal conduction pathways onto the FEP with submicrometer resolution capabilities, depending on the mask pattern.

Example 5

A fluorinated ethylene-propylene (FEP) patterned copolymer film having a oxyfluorinated surface was prepared by placing a Ni mask having 70-μm-wide lines separated by 150-μm-wide open regions in mechanical contact with a free-standing FEP film 50 μm thick. Modification was performed in an RFGD plasma with a radio-frequency power density of 1 W/ml at a pressure of 0.1 torr in a $H_2$-$CH_3OH$ mixture for 15 s.

The patterned surface so obtained was imaged as described in C. S. Dulcey et al, Science, vol. 252, p. 551 (1991); N. L. Abbott et al, ibid., vol. 257, p. 1380 (1992). Drops of liquid are placed on the patterned surface and observed by optical microscopy. Outward curvature of the drop indicates the extent to which the liquid spreads on the surface; inward curvature indicates that the liquid does not appreciably wet the surface. This approach was used to visualize the increased density of hydroxyl groups in selected surface regions of a plasma-treated fluoropolymer.

FIG. 1 shows the differential wetting characteristics of this surface when probed with drops of $Ch_3OH$ (right) and water (left). Water, when applied to the plasma-treated FEP surface, shows little or no detectable difference in wetting between the protected and exposed regions. The observed lack of wetting of the water drop is consistent with the results of previous surface analytical studies (T. G. Vargo et al, Langmuir, vol. 8, p. 130 (1992)), which showed that FEP is only partially defluorinated after treatment with the $H_2$—$CH_3OH$ plasma; the resulting hydroxylated FEP surface is still considerably hydrophobic, which is characteristic of the bulk fluoropolymer. However, differential wetting is clearly observed with $CH_3OH$, a less polar liquid, on the exposed regions of the FEP surface.

After plasma treatment, the FEP was functionalized in a solution of N-(2-aminoethyl)-3-aminopropyltrimethoxysilane (EDA). The surface was functionalized by treatment in a 0.1% (v/v) solution of EDA in hexane for ~20 s and then rinsed in hexanes. The EDA surface was catalyzed by immersion in a chloride-stabilized buffered catalyst solution as described in Example 1 at pH 5 for 30 min. The catalyzed surface was then metallized by immersion in a NIPOSIT 468® electroless plating bath (Shipley Company).

Figure 2:
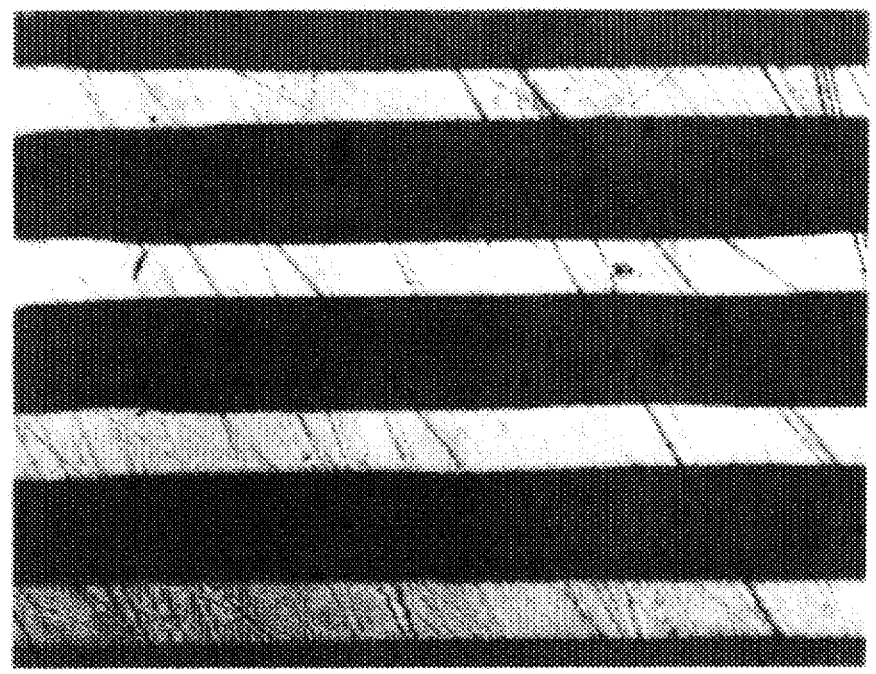
FIG. 2 is an optical micrograph of a selectively metallized fluorinated ethylene-propylene copolymer film.

The attachment of the EDA SAM film to the FEP surface was confirmed by secondary ion mass spectrometry and x-ray photoelectron spectroscopy analysis (D. J. Hook et el, Langmuir, vol. 7, p. 142 (1991); F. V. Bright et al, Anal. Chim. Acta, vol. 262, p. 323 (1992); T. G. Vargo et el, Langmuir, vol. 8, p. 130 (1992)). FIG. 2 shows metal lines each 70 μm wide selectively deposited on FEP by this process.

For adhesion testing, an FEP substrate was homogeneously hydroxylated, functionalized with EDA, and metallized with electroless Ni for 3 hours to produce a uniform mirror-like deposit of Ni ~2500 Å thick. Peel tests with both Scotch tape and American Society for Testing and Materials standard tape indicated the complete adhesion of the metal to the FEP surface. Covalent bonding of the organosilane to the hydroxylated fluoropolymer surface and coordinative bonding of the Pd catalyst to the EDA surface ligand are likely the key contributors to the high adhesion of the electroless deposit to the substrate.

Example 6

A sheet of piezoelectric PVDF (2×2 inches with thickness of 20 μm) is placed in a RFGD reactor and treated with a hydrogen/methanol plasma as described in Example III of U.S. Pat. No. 5,266,309 and reacted with an organosilane bearing a ligand from the amine, diamine and pyridine classes of silanizing agents. This includes such representative examples as aminopropyltriethoxysilane, ethylenediamine propyl silane and 2-ethylpyridyltrimethoxysilane. In order to initiate electroless metal deposition a Pd-based catalyst is used. In this example, the colloidal catalyst prepared by dissolving proportionate amounts equal to 11.5 mg of $Na_2PdCl_4$·$3H_2O$ in 1 ml of 1.0M NaCl (aq.) buffer, and adding 10 ml of 0.1M pH 5 morpholinoethanesulfonic acid (aq) buffer, and diluting to 100 ml with $H_2O$ is used. After standing at room temperature for at least 30 minutes, but optimally 24 hours, a 10 ml aliquot of the solution is removed and replaced with 10 ml of 1.0M NaCl (aq) to yield active PD1 catalyst. After removal from the catalyst bath the substrate material is then placed into an electroless plating bath, e.g., Niposit® 468, 10% strength from Shipley Co. This provides a surface comprised of nickel metal. CoB electroless plating bath can also be employed to provide a surface layer of cobalt metal.

Example 7

A sheet of Tedlar® (Dupont) (2×2 inches with thickness of 100 μm) was placed in a RFGD reactor and treated with a hydrogen/methanol plasma as described in Example III of U.S. Pat. No. 5,266,309 and reacted with aminopropyltriethoxysilane. In order to initiate electroless metal deposition a Pd-based catalyst was used. The colloidal catalyst was prepared by dissolving proportionate amounts equal to 11.5 mg of $Na_2PdCl_4$·$3H_2O$ in 1 ml of 1.0M NaCl (aq.) buffer, and adding 10 ml of 0.1M pH 5 morpholinoethanesulfonic acid (aq) buffer, and diluting to 100 ml with $H_2O$. After standing at room temperature for 24 hours, a 10 ml aliquot of the solution was removed and replaced with 10ml of 1.0M NaCl (aq) to yield active PD1 catalyst. After removal from the catalyst bath the substrate material was then placed into an electroless plating bath of Niposit® 468, 10% strength from Shipley Co. This provided a surface comprised of nickel metal, which passed the Scotch® tape peel test.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A fluoropolymer substrate having a metallized surface, prepared by a process comprising:
   (a) contacting (i) a fluoropolymer substrate having a surface with ligands which will bind an electroless metallization catalyst with (ii) an electroless metallization catalyst, to obtain a catalytic surface; and
   (b) contacting said catalytic surface with an electroless metallization solution, to obtain a metallized surface;
   wherein said ligands which will bind an electroless metallization catalyst are selected from the group consisting of $C_{1-4}$-alkylamino, di-$C_{1-4}$-alkylamino, 2-aminoethylamino, diethylenetriamino, pyridyl, bipyridyl, diphenylphosphino, mercapto, isonitrilo, nitrilo, imidazoyl, pyrrolyl, cyclopentadienyl, glycidoxy, and vinyl; and said electroless metallization catalyst is selected from the group consisting of palladium, platinum, rhodium, iridium, nickel, copper, silver, and gold.

2. The fluoropolymer substrate having a metallized surface of claim 1, wherein said metallized surface comprises a conductive layer of nickel, copper, gold, platinum, palladium, cobalt, or an alloy thereof.

3. The fluoropolymer substrate having a metallized surface of claim 1 wherein said metallized surface comprises an intermediate layer of nickel metal and an outer layer of a conductive metal.

4. The fluoropolymer substrate having a metallized surface of claim 3 wherein said conductive metal is platinum, gold, copper, alloys of nickel, or palladium.

5. The floropolymer substrate having a metallized surface of claim 1 wherein said metallized surface is in the form of a pattern.

6. A method for preparing a fluoropolymer substrate having a metallized surface comprising:
   (a) contacting (i) a fluoropolymer substrate having a surface with ligands which will bind an electroless metallization catalyst with (ii) an electroless metallization catalyst, to obtain a catalytic surface; and
   (b) contacting said catalytic surface with an electroless metallization solution, to obtain a metallized surface;
   wherein said ligands which will bind an electroless metallization catalyst are selected from the group consisting of $C_{1-4}$-alkylamino, di-$C_{1-4}$-alkylamino, 2-aminoethylamino, diethylenetriamino, pyridyl, bipyridyl, diphenylphosphino, mercapto, isonitrilo, nitrilo, imidazoyl, pyrrolyl, cyclopentadienyl, glycidoxy, and vinyl; and said electroless metallization catalyst is selected from the group consisting of palladium, platinum, rhodium, iridium, nickel, copper, silver, and gold.

7. The method of claim 6, wherein said fluoropolymer substrate having a surface with ligands which will bind an electroless metallization catalyst is prepared by a process comprising:
   (a') contacting a fluoropolymer substrate having a surface with hydroxyl groups with a compound of formula (I)

$$Y\text{-}(CH_2)_n\text{-}Si\text{-}(X)_3 \qquad (I)$$

wherein Y is any group which contains a ligand which will bind an electroless metallization catalyst, X is chlorine, bromine, fluorine, alkyl having 1 to 4 carbon atoms, chloromethyl, monoethylamino, dimethylamino, methoxy, ethoxy, propoxy, isopropoxy, butoxy, trimethylsilyl, or trimethylsilylamino; and n is an integer of from 1 to 17.

8. The method of claim 7, further comprising:
   (b') irradiating said surface having ligands which will bind an electroless metallization catalyst through a mask to remove a portion of said ligands from said surface.

9. The method of claim 7, wherein said fluoropolymer substrate having a surface with hydroxyl groups is prepared by a process comprising:
   (a") contacting a fluoropolymer with a gas/vapor plasma mixture comprising hydrogen and at least one member selected from the group consisting of water, methanol, and formaldehyde, while exposing said fluoropolymer to at least one radio frequency glow discharge under vacuum.

10. The method of claim 9, wherein said contacting of said fluoropolymer with said gas/vapor mixture while exposing to a radio frequency glow discharge is carried out through a mask to obtain a surface which has hydroxyl groups arranged in a pattern.

* * * * *

UNITED STATES PATENT AND TRADEMARK OFFICE
CERTIFICATE OF CORRECTION

PATENT NO. : 5,696,207
DATED : December 9, 1997
INVENTOR(S) : Terrence G. VARGO, et al.

It is certified that error appears in the above-identified patent and that said Letters Patent is hereby corrected as shown below:

On the title page, item [54], and on top of column 1, the first word of the title should be:

--FLUOROPOLYMERIC--

Signed and Sealed this

Seventeenth Day of February, 1998

Attest:

BRUCE LEHMAN

Attesting Officer

Commissioner of Patents and Trademarks